(12) United States Patent
Wang et al.

(10) Patent No.: US 11,507,168 B2
(45) Date of Patent: Nov. 22, 2022

(54) POWER MONITOR

(71) Applicant: DELTA ELECTRONICS, INC., Taoyuan (TW)

(72) Inventors: Kuan-Sheng Wang, Taoyuan (TW); Chien-Chung Chang, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 703 days.

(21) Appl. No.: 16/257,020

(22) Filed: Jan. 24, 2019

(65) Prior Publication Data

US 2019/0377398 A1 Dec. 12, 2019

(30) Foreign Application Priority Data

Jun. 8, 2018 (CN) .......................... 201810588440.1

(51) Int. Cl.
*G06F 1/3206* (2019.01)
*G01R 31/28* (2006.01)
*H03K 7/08* (2006.01)

(52) U.S. Cl.
CPC ....... *G06F 1/3206* (2013.01); *G01R 31/2851* (2013.01); *H03K 7/08* (2013.01)

(58) Field of Classification Search
CPC ...... G06F 1/3206; G01R 31/2851; H03K 7/08
See application file for complete search history.

(56) References Cited

U.S. PATENT DOCUMENTS

| 9,429,601 | B2 | 8/2016 | Ashikaga |
| 2005/0189348 | A1 | 9/2005 | Kitaizumi et al. |
| 2006/0186892 | A1 | 8/2006 | Hiramatsu et al. |
| 2015/0054494 | A1* | 2/2015 | Lin .......................... G05F 1/573 |
| | | | 324/123 R |

FOREIGN PATENT DOCUMENTS

| CN | 101572501 A | | 11/2009 |
| CN | 102195497 A | | 9/2011 |
| CN | 104698377 A | * | 6/2015 |
| CN | 104698377 A | | 6/2015 |
| CN | 105451922 A | | 3/2016 |
| CN | 106464010 A | | 2/2017 |
| DE | 102016008053 A1 | | 2/2017 |
| WO | 2015059906 A1 | | 4/2015 |

* cited by examiner

*Primary Examiner* — Jue Zhang
(74) *Attorney, Agent, or Firm* — CKC & Partners Co., LLC

(57) ABSTRACT

A power monitor includes a detecting circuit, a processing circuit, and a warning circuit. The detecting circuit detects a first abnormal condition of a primary side circuit and a second abnormal condition of a secondary side circuit. The processing circuit calculates a first class and a first occurring number of the first abnormal condition, and calculates a second class and a second occurring number of the second abnormal condition. The processing circuit determines whether the first occurring number is larger than a first predetermined number corresponding to the first class; if it is, the processing circuit outputs a first abnormal signal. The processing circuit determines whether the second occurring number is larger than a second predetermined number corresponding to the second class; if it is, the processing circuit outputs a second abnormal signal. The warning circuit outputs a warning signal according to the first or the second abnormal signal.

8 Claims, 4 Drawing Sheets

POWER MONITOR

RELATED APPLICATIONS

This application claims priority to China Application Serial Number 201810588440.1, filed Jun. 8, 2018, which is herein incorporated by reference.

BACKGROUND OF THE INVENTION

Field of Invention

The present invention relates to a monitor device. More particularly, the present invention relates to an intelligence power monitor.

Description of Related Art

In industry application, all kinds of machines that produce products need stable and uninterruptible power, so as to prevent the power from being abnormal or to prevent the power failure of the power from being occurred, such that the loss of the factory can be reduced.

For preventing the power from being abnormal or to prevent the power failure of the power from being occurred, a conventional power supply device has two power supplies. When any one of the power supplies is abnormal and needs to be repaired, the other one of the power supplies maintains supplying power. Another way is that the conventional power supply device has an uninterruptible power system (UPS). When the power supply device damages or the power failure of the power supply device occurs, the UPS can provide power to machines.

However, the conventional power supply device needs to have two power supplies, and the cost is therefore higher. No matter the conventional power supply device adopts having two power supplies manner or having UPS manner to maintain supplying power, this is a remedy after the conventional power supply device is already damaged or the power failure of the conventional power supply device occurs. The loss of the factory cost by the power supply device being damaged or the power failure of the conventional power supply device occurring is extremely high. The loss of the factory is sometimes beyond compute. Therefore, how to reduce the cost of the power supply device, and how to prevent the power supply device from being damaged or to prevent the power failure of the power supply device from occurring is a problem to be improved in the field.

SUMMARY OF THE INVENTION

The following presents a simplified summary of the disclosure in order to provide a basic understanding to the reader. This summary is not an extensive overview of the disclosure and it does not identify key/critical elements of the present invention or delineate the scope of the present invention.

One aspect of the present disclosure is directed to a power monitor. The power monitor comprises a detecting circuit, a processing circuit, and a warning circuit. The detecting circuit detects a first abnormal condition of a primary side circuit and a second abnormal condition of a secondary side circuit. The processing circuit calculates a first class and a first occurring number of the first abnormal condition, and calculates a second class and a second occurring number of the second abnormal condition. The processing circuit determines whether the first occurring number is larger than a first predetermined number corresponding to the first class; if it is, the processing circuit outputs a first abnormal signal. The processing circuit determines whether the second occurring number is larger than a second predetermined number corresponding to the second class; if it is, the processing circuit outputs a second abnormal signal. The warning circuit outputs a warning signal according to the first abnormal signal or the second abnormal signal.

Another aspect of the present disclosure is directed to a power monitor. The power monitor comprises a detecting circuit, a processing circuit, and a warning circuit. The detecting circuit is configured to detect an input voltage of an input capacitor of a primary side circuit of a power converter. The processing circuit is configured to compare a condition of the input voltage and a predetermined parameter, wherein if the condition of the input voltage and the predetermined parameter are different, the processing circuit outputs an abnormal signal. The warning circuit is configured to output a warning signal according to the abnormal signal.

These and other features, aspects, and advantages of the present invention, as well as the technical means and embodiments employed by the present invention, will become better understood with reference to the following description in connection with the accompanying drawings and appended claims.

BRIEF DESCRIPTION OF THE DRAWINGS

The invention can be more fully understood by reading the following detailed description of the embodiment, with reference made to the accompanying drawings as follows.

Figure 1:
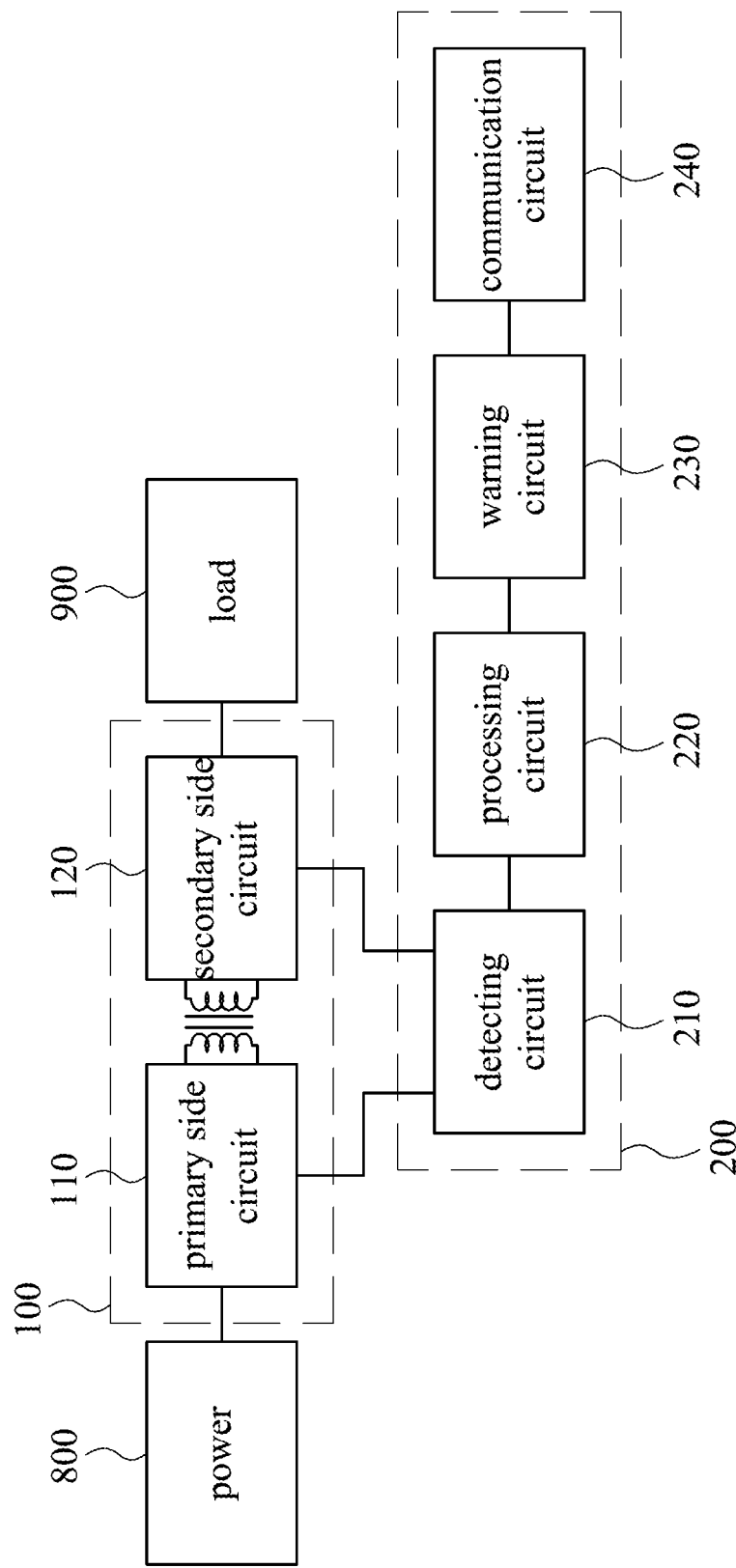
FIG. 1 is a circuit block diagram of a power supply device according to some embodiments of the present disclosure.

In accordance with common practice, the various described features/elements are not drawn to scale but instead are drawn to best illustrate specific features/elements relevant to the present invention. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include singular forms of the same.

FIG. 1 is a circuit block diagram of a power supply device according to some embodiments of the present disclosure. As shown in the figure, the power supply device includes a power converter 100 and a power monitor 200. The power monitor 200 includes a detecting circuit 210, a processing circuit 220, a warning circuit 230 and a communication circuit 240. With respect to connection, the power converter 100 is connected to a power 800 and a load 900. The detecting circuit 210 is connected to a primary side circuit 110 of the power converter 100, and connected to a secondary side circuit 120 of the power converter 100. The processing circuit 220 is connected to the detecting circuit 210. The warning circuit 230 is connected to the processing circuit 220. The communication circuit 240 is connected to the warning circuit 230.

With respect to operation, the power converter 100 transforms the energy provided by the power 800, and provides it to the load 900. In one embodiment, the power 800 can be but not limited to the power grid or other outer power. The power monitor 200 is configured to monitor the condition of the power converter 100, and inform users immediately when the power converter 100 is abnormal, so as to prevent the power supply device from being damage/power failure, which will be described in detail as below.

The detecting circuit 210 of the power monitor 200 detects a first abnormal condition of the primary side circuit 110 of the power converter 100 and a second abnormal condition of the secondary side circuit 120 of the power converter 100 in real time. The processing circuit 220 then calculates a first class and a first occurring number of the first abnormal condition, and calculates a second class and a second occurring number of the second abnormal condition. For example, when the energy provided by the power 800 is high, the primary side circuit 110 will receive a high voltage. Meanwhile, the detecting circuit 210 will detect the above-mentioned abnormal condition, and the processing circuit 220 then calculates a class of the abnormal condition (e.g., 1000 volts/750 volts are two kinds of different classes) and a happened number of the abnormal condition. In addition, when the electricity usage demand of the load 900 increases, an overload condition will happen in the secondary side circuit 120. Meanwhile, the detecting circuit 210 will detect the above-mentioned abnormal condition, the processing circuit 220 then calculates the class of the abnormal condition (e.g., overload time: 10 seconds/overload time: 3 seconds are two kinds of different classes) and the happened number of the abnormal condition.

Subsequently, the processing circuit 220 of the power monitor 200 further determines whether a first occurring number is larger than a first predetermined number corresponding to the first class. If it is, the processing circuit 220 outputs a first abnormal signal. Besides, the processing circuit 220 determines whether a second occurring number is larger than a second predetermined number corresponding to the second class. If it is, the processing circuit 220 outputs a second abnormal signal. In one embodiment, the processing circuit 220 receives the first predetermined number corresponding to the first class and the second predetermined number corresponding to the second class from a look-up table. For example, the processing circuit 220 receives a related predetermined number according to the class of the abnormal condition of the primary side circuit 110 (e.g., 1000 volts/750 volts). When the class of the abnormal condition is 1000 volts, the damage to the primary side circuit 110 is high due to the abnormal voltage is high. Therefore, the acceptable number of the 1000 volts is predetermined to be 5. If the shock number to the primary side circuit 110 is more than 5, the processing circuit 220 outputs the abnormal signal. In contrast, when the class of the abnormal condition is 750 volts, the damage to the primary side circuit 110 is low due to the abnormal voltage is low. Therefore, the acceptable number of the 750 volts is predetermined to be 20. If the shock number to the primary side circuit 110 is more than 20, the processing circuit 220 then outputs the abnormal signal.

The condition of the secondary side circuit 120 is that the processing circuit 220 receives a corresponding predetermined number according to the class of the abnormal condition of the secondary side circuit 120 (e.g., overload time: 10 seconds/overload time: 3 seconds). When the class of the abnormal condition is that the overload time is 10 seconds, the damage to the secondary side circuit 120 is high due to the overload time is long. Therefore, the acceptable number of the 10 seconds overload time is predetermined to be 50. If the happened time of the overload condition to the secondary side circuit 120 is more than 50, the processing circuit 220 outputs the abnormal signal. In contrast, when the class of the abnormal condition is that the overload time is 3 seconds, the damage to the secondary side circuit 120 is low due to the overload time is low. Therefore, the acceptable number of the 3 seconds overload time is predetermined to be 100. If the happened time of the overload condition to the secondary side circuit 120 is more than 100, the processing circuit 220 then outputs the abnormal signal.

In addition, the warning circuit 230 will output a warning signal according to the first abnormal signal corresponding to the primary side circuit 110, or the warning circuit 230 will output the warning signal according to the second abnormal signal corresponding to the secondary side circuit 120. For example, when the shock number to the primary side circuit 110 by 1000 volts is more than 5, the damage of elements inside the primary side circuit 110 may achieve the damage tolerance. The elements inside the primary side circuit 110 will break down at any time if keep using the elements. Meanwhile, the warning circuit 230 will output the warning signal, so as to remind users to change the elements inside the primary side circuit 110, in order to avoid damage/power failure of the power supply device. Similarly, when the happened time of the 10 seconds overload condition to the secondary side circuit 120 is more than 50, the damage of the elements inside the secondary side circuit 120 may achieve the damage tolerance. The elements inside the secondary side circuit 120 will break down at any time if keep using the elements. Meanwhile, the warning circuit 230 will output the warning signal, so as to remind users to change the elements inside the secondary side circuit 120, in order to avoid damage/power failure of the power supply device.

The abnormal conditions of the primary side circuit 110 and the secondary side circuit 120 of the power converter 100 in the present disclosure are not intended to be limited to the above-mentioned embodiments. For example, the abnormal condition of the primary side circuit 110 can also be voltage abnormal, current abnormal, surge or other condition which may damage circuits, and the abnormal condition of the secondary side circuit 120 can also be voltage abnormal, current abnormal, overload or other condition which may damage circuits.

In one embodiment, the power monitor 200 of the present disclosure can be used in remote monitor field. The power monitor 200 may include a communication circuit 240. If the primary side circuit 110 or the secondary side circuit 120 of the power converter 100 is abnormal, the communication circuit 240 can be used to transmit the warning signal to a remote monitor system (not shown) through a wired manner or a wireless manner, such that users can monitor the power converters easily in a remote manner. If the abnormal condition happens, staff whose location near the abnormal power converter 100 will be noticed to fix the abnormal power converter 100. In addition, the power monitor 200 further uses the detecting circuit 210 to detect the primary side circuit 110 or the secondary side circuit 120 of the power converter 100 for generating detection data. The communication circuit 240 is further used to transmit detailed detection data (e.g., abnormal condition data) to the remote monitor system. The remote monitor system collects all conditions for big data analyzing, and adaptively adjusts the power monitor 200 or the parameter of the look-up table according to analyzing result, such that the power monitor 200 can further monitor and give a waring intelligently.

Figure 2:
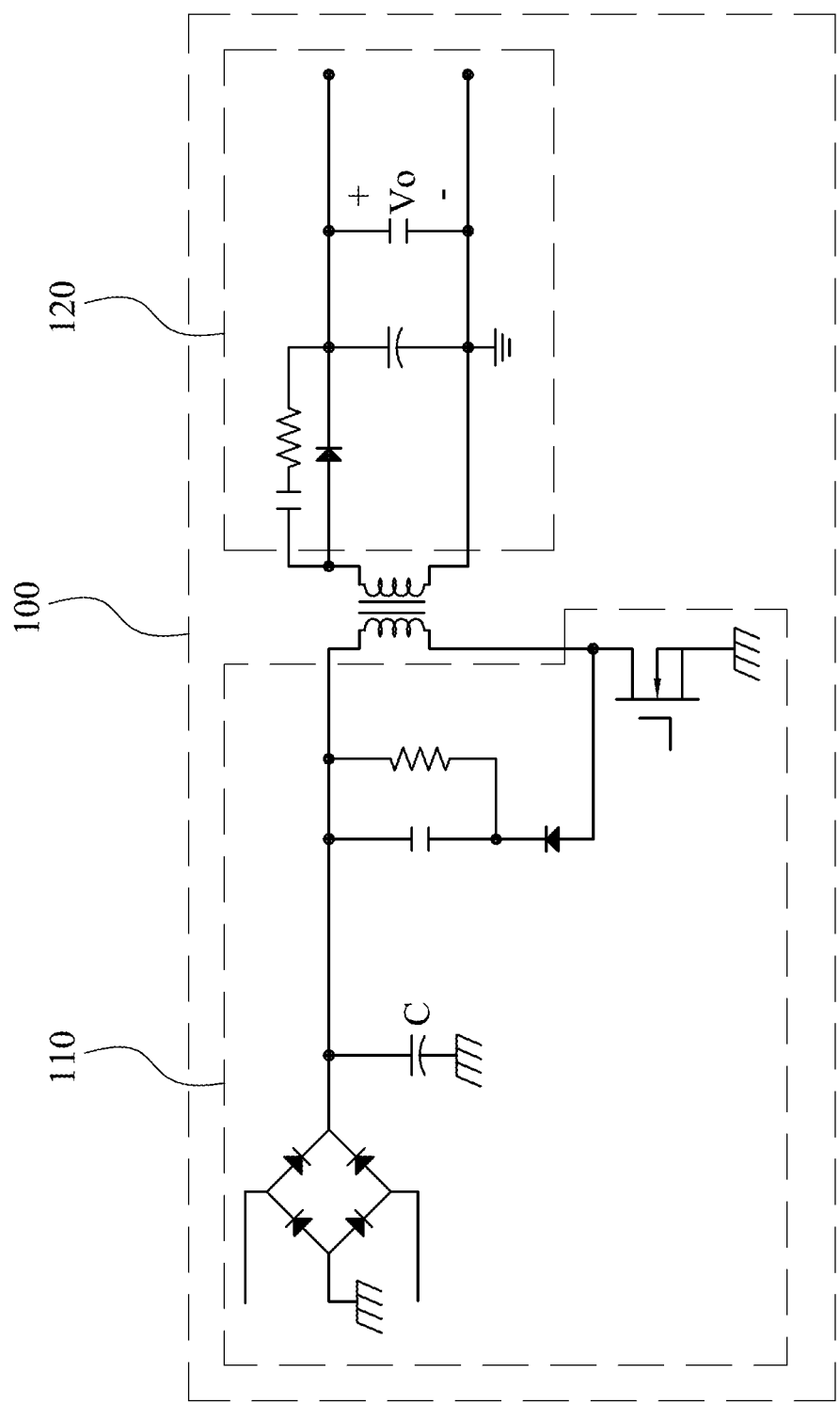
FIG. 2 is a diagram of a power converter of the power supply device as illustrated in FIG. 1 according to some embodiments of the present disclosure.

FIG. 2 is a detailed circuit diagram of a power converter 100 as illustrated in FIG. 1 according to some embodiments of the present disclosure. The power converter 100 used herein is a flyback converter. However, the embodiment is used for illustration purpose, and the present disclosure is not limited to the circuit as shown in the embodiment regarding FIG. 2. The power converter 100 can be a forward converter, a half-bridge converter, a full-bridge converter or other type converter.

Figure 3:
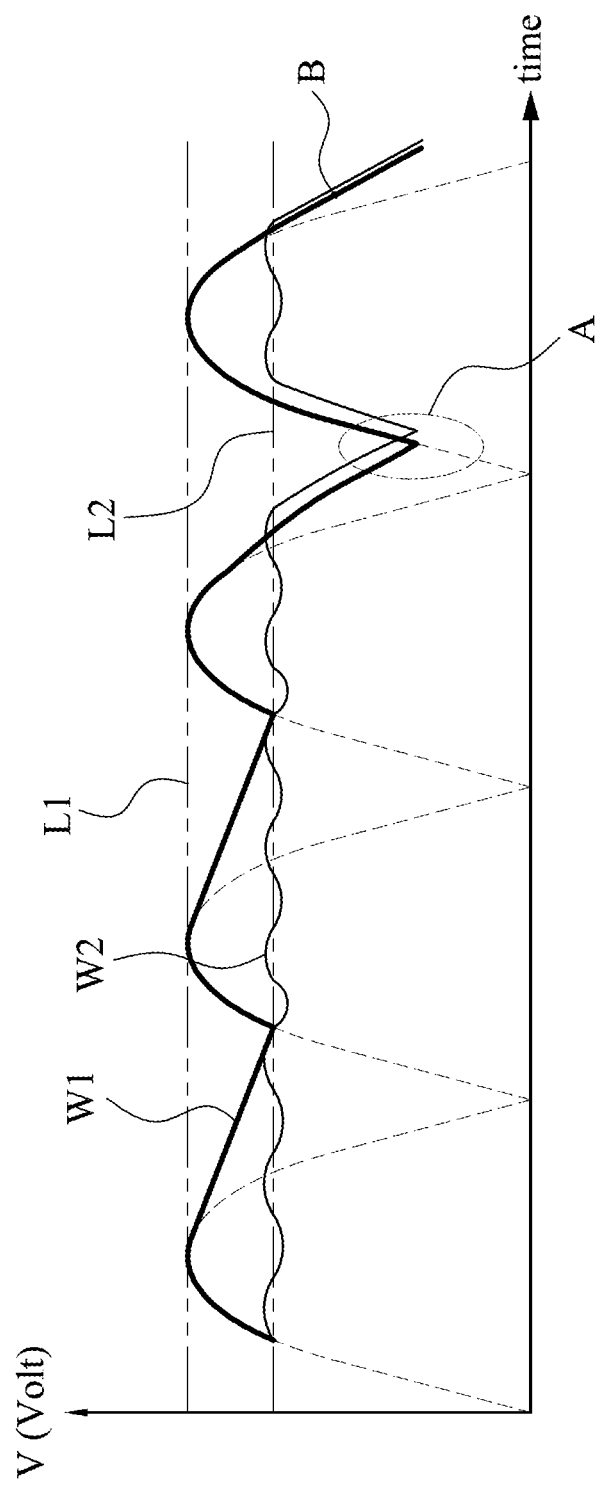
FIG. 3 is a diagram of a voltage waveform according to some embodiments of the present disclosure.

Reference is now made to both FIG. 1 and FIG. 2. The detecting circuit 210 of the power monitor 200 is configured to detect voltage of the input capacitor C of the primary side circuit 110 (i.e., the voltage of the input capacitor C is called input voltage herein). Subsequently, the processing circuit 220 is configured to compare a condition of the input voltage and a predetermined parameter. If the condition of the input voltage and the predetermined parameter are different, the processing circuit 220 outputs an abnormal signal. The warning circuit 230 then outputs a warning signal according to the abnormal signal. The warning signal is transmitted to a remote monitor device (not shown) through the communication circuit 240 so as to notice users. In addition, for facilitating the understanding of the technology of the power monitor in the present disclosure, reference is made to FIG. 3, which is a diagram of a voltage waveform according to some embodiments of the present disclosure. The voltage waveform W1 as shown in FIG. 3 is the voltage waveform of the input capacitor C of the primary side circuit 110 as shown in FIG. 2, and the voltage waveform W2 as shown in FIG. 3 is the output voltage waveform of the secondary side circuit 120 as shown in FIG. 2. The present disclosure has multiple power monitor technologies, which will be described in detail as below.

Reference is now made to FIGS. 1-3. With respect to wave trough detection, the processing circuit 220 is configured to determine whether a wave trough of the input voltage W1 is lower than a predetermined wave trough voltage. For example, a predetermined wave trough voltage L2 is set. If the wave trough of the input voltage W1 is lower than the predetermined wave trough voltage L2 (i.e., the A point as shown in FIG. 3), it represents that an abnormal condition occurs. Meanwhile, the processing circuit 220 outputs the abnormal signal. Aging process of the input capacitor C occurs when the input capacitor C is used after a period of time. If the input capacitor is an electrolytic capacitor, the electrolyte solution therein will decrease as time goes on, such that the performance of the input capacitor declines. Conventional detection manner is to detect the output voltage W2 of the secondary side circuit, and a waring is given when the output voltage W2 is abnormal. However, as discussed above, the element that introduces problems is in the primary side circuit, which results in the decreasing of the input voltage W1. The conventional manner, to give a waring when detecting that the output voltage W2 of the secondary side circuit being abnormal, is putting the cart before the horse. If the wave trough detection manner of the present disclosure is used as the power monitor manner, the aging process of the input capacitor C of the primary side circuit 110 will be found directly/efficiently (i.e., detecting that the input voltage W1 is lower than the predetermined wave trough voltage L2, which represents the input capacitor C ages), such that the input capacitor C can be changed immediately. As such, the condition of performance decreasing/damage of the power supply device can be prevented in advance so as to prevent the output ripple wave from becoming larger.

With respect to peak value detection, the processing circuit 220 is configured to determine whether a peak of the input voltage W1 is larger than a predetermined peak voltage value. For example, a predetermined peak voltage value L1 is set. If the peak of the input voltage W1 is larger than the predetermined peak voltage value L1, it represents that an abnormal condition occurs. Meanwhile, the processing circuit 220 outputs the abnormal signal. For detecting whether power provided by an outer power (e.g., a power grid) is abnormal, conventional detection manner is to detect the output voltage W2 of the secondary side circuit as well, and a waring is given when the output voltage W2 is abnormal. However, as discussed above, the element that introduces problems is in the primary side circuit receiving power from the outer power, which results in the increasing of the input voltage W1. The conventional manner, to give a waring when detecting that the output voltage W2 of the secondary side circuit being abnormal, is also putting the cart before the horse. If the peak value detection manner of the present disclosure is used as the power monitor manner, the input voltage W1 of the primary side circuit 110 can be detected in a real time. If the peak of the input voltage W1 is larger than a predetermined peak voltage value for too many times, the input capacitor C will be damaged seriously. Meanwhile, the input capacitor C can be changed immediately. As such, the condition of performance decreasing/damage of the power supply device can be prevented in advance so as to prevent the output ripple wave from becoming larger.

With respect to difference value detection, the processing circuit 220 is configured to determine whether a wave motion difference value of the input voltage (i.e. a peak to peak value of the input voltage) is larger than a predetermined voltage difference value. If the wave motion difference value of the input voltage is larger than the predetermined voltage difference value, it represents that a wave motion of a power provided by the power 800 is too large. As such, the input capacitor C will also be damaged. Conventional detection manner is to detect the output voltage W2 of the secondary side circuit as well, and a waring is given when the output voltage W2 is abnormal. However, as discussed above, the element that introduces problems is in the primary side circuit. The conventional manner, to give a waring when detecting that the output voltage W2 of the secondary side circuit is abnormal, is also putting the cart before the horse. The difference value detection manner of the present disclosure is used as the power monitor manner. If the wave motion difference value of the input voltage W1 is larger than a predetermined wave motion difference value for too many times, the input capacitor C of the primary side circuit 110 will be damaged seriously. At this time, the input capacitor C can be changed immediately. As such, the condition of performance decreasing/damage of the power supply device can be prevented in advance so as to prevent the output ripple wave from becoming larger.

With respect to unit time variation rate detection, the processing circuit 220 is configured to determine whether a waveform unit time variation rate of the input voltage is larger than predetermined unit time variation rate. If the waveform unit time variation rate of the input voltage is larger than a predetermined unit time variation rate (i.e., the point B as shown in FIG. 3), it represents that an over load condition occurs. As such, the capacitor C will also be damaged. If the over load condition happens for too many times, the input capacitor C will be damaged seriously. Meanwhile, the input capacitor C can be changed immediately. As such, the condition of performance decreasing/damage of the power supply device can be prevented in advance so as to prevent the output ripple wave from becoming larger. In addition, when the over load condition happens, that is the output current of the secondary side circuit 120 is too large (i.e., the output current is larger than a predetermined output current), the processing circuit 220 outputs the protection signal to a remote monitor system (not shown) in advance. The remote monitor system can monitor the whole system, and the remote monitor system controls the power converter 100 in advance so as to prevent the power supply device from damage. Subsequently, the processing circuit 220 outputs the abnormal signal to the warning circuit 230, and the warning circuit 230 outputs the warning signal to notice users to do related processing. For example, the processing circuit 220 can output the protection signal to the remote monitor system in advance, and the remote monitor system changes the power converter 100, lowers the load of the power converter 100 or to do other suitable processing. As such, before the warning circuit 230 notices users to do related processing, the power converter 100 can be protected by performing protection processes in advance so as to further prevent the power supply device from damage.

Figure 4:
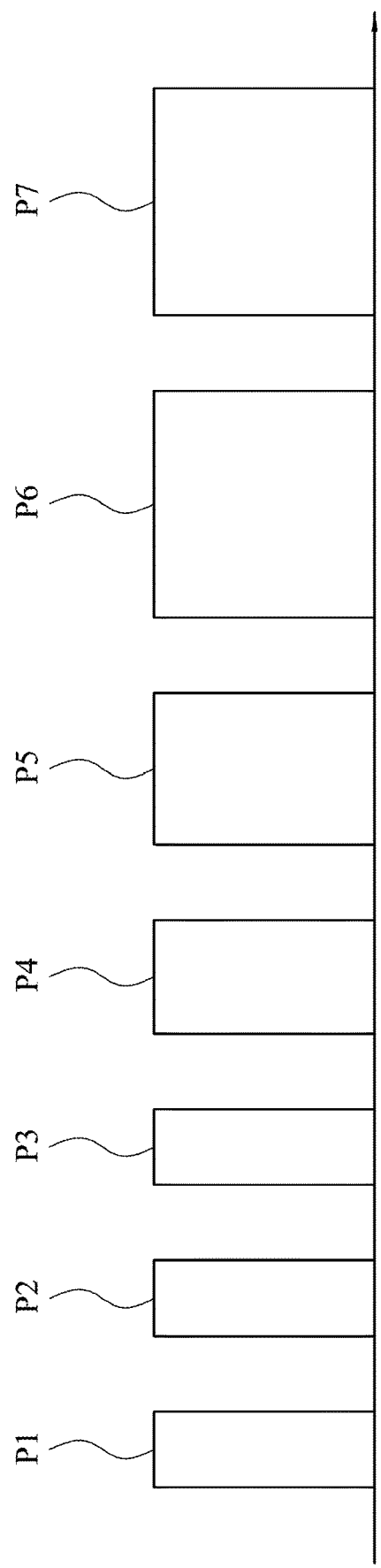
FIG. 4 is a diagram of a Pulse Width Modulation (PWM) waveform according to some embodiments of the present disclosure.

FIG. 4 is a diagram of a Pulse Width Modulation (PWM) waveform according to some embodiments of the present disclosure. The control manner of the switches in the primary side circuit 110 as shown in FIG. 2 is, for example, a pulse width modulation (PWM). The widths of the pulse width modulation signals P1-P3 are normal. As shown in FIG. 4, the widths of the pulse width modulation signals are increasing from the pulse width modulation signal P4. The width of the pulse width modulation signal P6 is too large, and it represents that the abnormal condition occurs, which is probably caused by the over loading condition. The width of the pulse width modulation of the present disclosure is used as the power monitor manner. A width of the pulse width modulation signal is set to be a predetermined width of the pulse width modulation signal. For example, the predetermined width of the pulse width modulation signal is the width of the pulse width modulation signal P5. If the processing circuit 220 determines that the width of the pulse width modulation signal of the switch in the primary side circuit 110 is different from the predetermined width (e.g., large than the width of the pulse width modulation signal P5), the processing circuit 220 does not output the abnormal signal to give a warning until the abnormal condition occurs (i.e., the pulse width modulation P6), but outputs the abnormal signal in advance. As such, the performance decreasing/damage of the power supply device can be prevented in advance. In addition, with respect to frequency detection, when the control manner of the switch in the primary side circuit 110 is changed into pulse frequency modulation (PFM), the processing circuit 220 determines whether the frequency of the control signal of the switch in the primary side circuit 110 is different from the predetermined frequency. If the frequency of the pulse frequency modulation signal of the switch of the primary side circuit 110 is different from the predetermined frequency, the processing circuit 220 outputs the abnormal signal. For example, the normal frequency of the pulse frequency modulation signal is ranged from 60 kHz-80 kHz. When the frequency of the pulse frequency modulation signal is 200 kHz, it represents that the abnormal condition occurs, which is probably introduced by over loading. The pulse frequency modulation signal of the present disclosure is used as the power monitor manner. A predetermined frequency is set such as 100 kHz. If the processing circuit 220 determines that the frequency of the pulse frequency modulation signal of the switch of the primary side circuit 110 is larger than the predetermined frequency, the processing circuit 220 does not output the abnormal signal to give a warning until the abnormal condition occurs (i.e., the frequency of the pulse frequency modulation signal is 200 kHz), but outputs the abnormal signal in advance. As such, the condition of performance decreasing/damage of the power supply device can be prevented in advance.

In view of the above embodiments of the present disclosure, it is apparent that the application of the present invention has the advantages as follows. In view of the foregoing, embodiments of the present disclosure provide a power monitor. The power monitor of the present disclosure can forecast the condition of the power converter intelligently so as to change the element or do other related processing in advance. Therefore, the power converter can be maintained in normal condition, and almost has no chance to be damage/power failure. For preventing the conventional power supply device from damage/power failure, the conventional power supply device needs two power supplies. Compared with the conventional power supply device with two power supplies, the present disclosure needs single power supply. Therefore, the cost of the power supply device is reduced. In addition, the aging elements can be changed in advance so as to maintain the power supply in high efficiency condition, such that the output ripple wave can be prevented from becoming larger or other related standards of the power supply device can be prevented from being abnormal.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A power monitor, comprising:
    a detecting circuit configured to detect an input voltage of an input capacitor of a primary side circuit of a power converter;
    a processing circuit configured to compare a condition of the input voltage and a predetermined parameter, wherein if the condition of the input voltage and the predetermined parameter are different, the processing circuit outputs an abnormal signal; and a warning circuit configured to output a warning signal according to the abnormal signal;

wherein the processing circuit is configured to determine whether a wave motion difference value of the input voltage is larger than a predetermined voltage difference value, or the processing circuit is configured to determine whether a waveform unit time variation rate of the input voltage is larger than a predetermined unit time variation rate.

2. The power monitor of claim 1, wherein the processing circuit is configured to determine whether a wave trough of the input voltage is lower than a predetermined voltage, wherein if the wave trough of the input voltage is lower than the predetermined voltage, the processing circuit outputs the abnormal signal.

3. The power monitor of claim 1, wherein the processing circuit is configured to determine whether a peak of the input voltage is larger than a predetermined voltage, wherein if the peak of the input voltage is larger than the predetermined voltage, the processing circuit outputs the abnormal signal.

4. The power monitor of claim 1, wherein if the wave motion difference value of the input voltage is larger than the predetermined voltage difference value, the processing circuit outputs the abnormal signal.

5. The power monitor of claim 1, wherein if the waveform unit time variation rate of the input voltage is larger than the predetermined unit time variation rate, the processing circuit outputs the abnormal signal.

6. The power monitor of claim 1, wherein the processing circuit is configured to determine whether a width of a pulse width modulation of a switch in the primary side circuit is different from a predetermined width, wherein if the width of the pulse width modulation of the switch in the primary side circuit is different from the predetermined width, the processing circuit outputs the abnormal signal.

7. The power monitor of claim 1, wherein the processing circuit is configured to determine whether a frequency of a switch of the primary side circuit is different from a predetermined frequency, wherein if the frequency of the switch of the primary side circuit is different from the predetermined frequency, the processing circuit outputs the abnormal signal.

8. The power monitor of claim 1, wherein the detecting circuit is further configured to detect an output current of a secondary side circuit of the power converter, wherein in condition that the processing circuit compares and determines that the output current of the secondary side circuit of the power converter is larger than a predetermined output current, the processing circuit outputs the abnormal signal after the processing circuit outputs a protection signal to a remote monitor system.

* * * * *